United States Patent [19]
Jucha et al.

[11] Patent Number: 4,878,994
[45] Date of Patent: Nov. 7, 1989

[54] METHOD FOR ETCHING TITANIUM NITRIDE LOCAL INTERCONNECTS

[75] Inventors: Rhett B. Jucha, Celeste; Cecil J. Davis, Greenville; Tom Tang, Dallas; Lee M. Loewenstein, Plano, all of Tex.

[73] Assignee: Texas Instruments Incorporated, Dallas, Tex.

[21] Appl. No.: 174,649

[22] Filed: Mar. 29, 1988

Related U.S. Application Data

[63] Continuation-in-part of Ser. No. 74,415, Jul. 16, 1987.

[51] Int. Cl.$^4$ .................... C23F 1/02; B44C 1/22; C03C 15/00; H01L 21/306
[52] U.S. Cl. .................... 156/643; 156/646; 156/656; 156/659.1; 156/667; 204/192.35; 204/192.37; 427/38
[58] Field of Search .................... 134/1; 156/643, 646, 156/655, 656, 659.1, 664, 667; 427/38, 39; 204/192.32, 192.35, 192.37

[56] References Cited

U.S. PATENT DOCUMENTS 4,673,456 6/1987 Spencer et al. .................... 156/345
4,687,544 8/1987 Bersin .................... 156/643

Primary Examiner—William A. Powell
Attorney, Agent, or Firm—B. Peter Barndt; James T. Comfort; Melvin Sharp

[57] ABSTRACT

A process for the etching of titanium containing film which utilizes both in situ and remote plasmas, and a gas mixture for the plasmas which comprises a halogen gas at low pressure and moderate temperature to produce an etch which is both selective to selected materials, for example, titanium silicide etc., and anisotropic.

53 Claims, 3 Drawing Sheets

METHOD FOR ETCHING TITANIUM NITRIDE LOCAL INTERCONNECTS

CROSS REFERENCE TO RELATED APPLICATIONS

The present application is a continuation-in-part of pending U.S. patent application Ser. No. 074,415, filed Jul. 16, 1987.

The present application incorporates by reference each of the following applications which are related cases of a common assignee and contain related subject matter:

Ser. No. 060,991, filed 06/12/87, pending, *Vacuum Slice Carrier*, which is a continuing application of Ser. No. 790,918, filed 10/24/85 by Davis, Cecil and Matthews, Robert; now abandoned;

Ser. No. 060,976 filed 06/12/87, abandoned, *Advanced Vacuum Processor*, which is a continuing application of Ser. No. 790,708, filed 10/24/85 by Davis, Cecil; Spencer, John; Wooldridge, Tim; and Carter, Duane; now abandoned;

U.S. Pat. No. 4,687,542, issued Aug. 18, 1987, entitled *Vacuum Processing System* by Davis, Cecil; Matthews, Robert; and Hildenbrand, Randall;

U.S. Pat. No. 4,659,413 issued Apr. 21, 1987 entitled *Automated Single Slice Cassette Load Lock Plasma Reactor* by Davis, C., et al.

U.S. Pat. No. 4,657,628 issued Apr. 14, 1987 entitled *Process for Patterning Local Interconnects* by Holloway, T. C., et al.

U.S. Pat. No. 4,675,073 issued Jun. 23, 1987, entitled *TiN Etch Process* by Douglas, M. A.;

Ser. No. 790,707, filed 10/24/85, U.S. Pat. No. 4,685,999, entitled *Apparatus for Plasma-Assisted Etching* by Davis, Cecil; Carter, Duane; and Jucha, Rhett;

Ser. No. 061,017, filed 06/12/87, abandoned, entitled *Integrated Circuit Processing System*; which is a continuing application of Ser. No. 824,342, filed 1/30/86, now abandoned, by Davis, Cecil; Bowling, Robert; and Matthews, Robert; and Ser. No. 915,608, filed 10/06/86, U.S. Pat. No. 4,718,975, entitled *Movable Particle Shield* by Bowling, Robert; Larrabee, Graydon; and Liu, Benjamin;

Ser. No. 837,611 filed 03/07/86 pending, entitled *VLSI Local Interconnect Method and Structure* by Haken, Roger A. et al.;

Ser. No. 074,448, filed 7/16/87, pending, entitled *Processing Apparatus and Method*; by Davis, Cecil; Matthews, Robert; Loewenstein, Lee; Abernathy, Joe; and Wooldridge, Timothy;

Ser. No. 075,016, filed 7/17/87, pending, entitled *Processing Apparatus and Method*; by Davis, Cecil; Loewenstein, Lee; Matthews, Robert; and Jones, John;

Ser. No. 073,943, filed 7/16/87, pending, entitled *Processing Apparatus and Method*; by Loewenstein, Lee; Rose, Alan; Kennedy, Robert III; Huffman, Craig; and Davis, Cecil;

Ser. No. 073,948, filed 7/16/87, pending, entitled *Processing Apparatus and Method*; by Loewenstein, Lee;

Ser. No. 073,942, filed 7/16/87, pending entitled *Processing Apparatus and Method*; by Jucha, Rhett; and Davis, Cecil;

Ser. No. 074,419, filed 7/16/87, pending, entitled *Processing Apparatus and Method*; by Davis, Cecil; and Matthews, Robert;

Ser. No. 074,377, filed 7/16/87, pending, entitled *Processing Apparatus and Method*; by Davis, Cecil; Jucha, Rhett; Hildenbrand, Randall; Schultz, Richard; Loewenstein, Lee; Matthews, Robert; Huffman, Craig; and Jones, John;

Ser. No. 074,398, filed 7/16/87, abandoned, entitled *Processing Apparatus and Method*; by Davis, Cecil; Loewenstein, Lee; Jucha, Rhett; Matthews, Robert; Hildenbrand, Randall; Freeman, Dean; and Jones, John;

Ser. No. 074,456, filed 7/16/87, pending, entitled *Processing Apparatus and Method*; by Davis, Cecil; Jucha, Rhett; Luttmer, Joseph; York, Rudy; Loewenstein, Lee; Matthews, Robert; and Hildenbrand, Randall;

Ser. No. 074,399, filed 7/16/87, abandoned, entitled *Processing Apparatus and Method*; by Jucha, Rhett; and Davis, Cecil;

Ser. No. 074,450, filed 7/16/87, pending, entitled *Processing Apparatus and Method*; by Jucha, Rhett; Davis, Cecil; and Jones, John;

Ser. No. 074,375, filed 7/16/87, pending, entitled *Processing Apparatus and Method*; by Jucha, Rhett; Carter, D.; Davis, Cecil; and Crank S.;

Ser. No. 074,411, filed 7/16/87, pending, entitled *Processing Apparatus and Method*; by Jucha, Rhett; Davis, Cecil; Carter, D.; Crank, S.; and Jones, John;

Ser. No. 074,390, filed 7/16/87, abandoned, entitled *Processing Apparatus and Method*; by Jucha, Rhett; Davis, Cecil; and Crank S.;

Ser. No. 074,114, filed 7/16/87, abandoned, entitled *Processing Apparatus and Method*; by Davis, Cecil; Loewenstein, Lee; Freeman, Dean; and Burris, James;

Ser. No. 074,373, filed 7/16/87, pending, entitled *Processing Apparatus and Method*; by Freeman, Dean; Burris, James; Davis, Cecil; and Loewenstein, Lee;

Ser. No. 074,391, filed 7/16/87, pending, entitled *Processing Apparatus and Method*; by Freeman, Dean; Burris, James; Davis, Cecil; and Loewenstein, Lee:

Ser. No. 074,451, filed 7/16/87, pending, entitled *Processing Apparatus and Method*; by Luttmer, Joseph; Davis, Cecil; Smith, Patricia; York, Rudy; Loewenstein, Lee; and Jucha, Rhett;

Ser. No. 073,945, filed 7/16/87, pending, entitled *Processing Apparatus and Method*; by Luttmer, Joseph, Davis, Cecil; Smith, Patricia; and York, Rudy;

Ser. No. 073,936, filed 7/16/87, abandoned, entitled *Processing Apparatus and Method*; by Luttmer, Joseph, Davis, Cecil; Smith, Patricia; and York, Rudy;

Ser. No. 074,111, filed 7/16/87, abandoned, entitled *Processing Apparatus and Method*; by Luttmer, Joseph, York, Rudy; Smith, Patricia; and Davis, Cecil;

Ser. No. 074,386, filed 7/16/87, pending, entitled *Processing Apparatus and Method*; by York, Rudy; Luttmer, Joseph; Smith, Patricia; and Davis, Cecil;

Ser. No. 074,407, filed 7/16/87, abandoned, entitled *Processing Apparatus and Method*; by York, Rudy; Luttmer, Joseph; Smith, Patricia; and Davis, Cecil;

Ser. No. 075,018, filed 7/16/87, pending, entitled *Processing Apparatus and Method*; by Davis, Cecil; Abernathy, Joe; Matthews, Robert; Hildenbrand, Randall; Simpson, Bruce; Bohlman, James; Loewenstein, Lee; and Jones, John;

Ser. No. 074,112, filed 7/16/87, pending, entitled *Processing Apparatus and Method*; by Davis, Cecil; Matthews, Robert; York, Rudy; Luttmer, Joseph; Jakubik, Dwain; and Hunter, James;

Ser. No. 074,449, filed 7/16/87, pending, entitled *Processing Apparatus and Method*; by Davis, Cecil; Smith, Greg; Matthews, Robert; Jones, John; Smith, James; and Schultz, Richard;

Ser. No. 074,406, filed 7/16/87, abandoned, entitled *Processing Apparatus and Method*; by Davis, Cecil; Freeman, Dean; Matthews, Robert; Tomlin, Joel;

Ser. No. 073,941, filed 7/16/87, pending, entitled *Processing Apparatus and Method*; by Davis, Cecil; Loewenstein, Lee; Tipton, Charlotte; Smith, Randee, Pohlmeier, R.; Jones, John; Bowling, Robert; and Russell, I;

Ser. No. 074,371, filed 7/16/87, pending, entitled *Processing Apparatus and Method*; by Loewenstein, Lee; and Davis, Cecil;

Ser. No. 074,418, filed 7/16/87, abandoned, entitled *Processing Apparatus and Method*; by Fisher, Wayne;

Ser. No. 073,934, filed 7/16/87, abandoned, entitled *Processing Apparatus and Method*; by Fisher, Wayne; Bennett, Tommy; Davis, Cecil; and Matthews, Robert;

Ser. No. 074,403, filed 7/16/87, abandoned, entitled *Processing Apparatus and Method*; by Davis, Cecil; Matthews, Robert; and Fisher, Wayne;

Ser. No. 075,019, filed 7/17/87, pending, entitled *Processing Apparatus and Method*; by Davis, Cecil; Freeman, Dean; Matthews, Robert; and Tomlin, Joel;

Ser. No. 073,939, filed 7/16/87, abandoned, entitled *Processing Apparatus and Method*; by Davis, Cecil; Abernathy, Joe; Matthews, Robert, Hildenbrand, Randy; Simpson, Bruce; Bohlman, James; Loewenstein, Lee; and Jones, John;

Ser. No. 073,944, filed 7/16/87, pending, entitled *Processing Apparatus and Method*; by Cecil, Davis and Jucha, Rhett;

Ser. No. 073,935, filed 7/16/87, abandoned, entitled *Processing Apparatus and Method*; by Liu, Jiann; Davis, Cecil; and Loewenstein, Lee;

Ser. No. 074,129, filed 7/16/87, pending, entitled *Processing Apparatus and Method*; by Loewenstein, Lee; Freeman, Dean; and Davis, Cecil;

Ser. No. 074,455, filed 7/16/87, pending, entitled *Processing Apparatus and Method*; by Loewenstein, Lee; Freeman, Dean; and Davis, Cecil;

Ser. No. 074,453, filed 7/16/87, pending, entitled *Processing Apparatus and Method*; by Loewenstein, Lee; Freeman, Dean; and Davis, Cecil;

Ser. No. 073,949, filed 7/16/87, abandoned, entitled *Processing Apparatus and Method*; by Loewenstein, Lee; and Davis, Cecil;

Ser. No. 074,379, filed 7/16/87, pending, entitled *Processing Apparatus and Method*; by Loewenstein, Lee; and Davis, Cecil;

Ser. No. 073,937, filed 7/16/87, abandoned, entitled *Processing Apparatus and Method*; by Loewenstein, Lee; and Davis, Cecil;

Ser. No. 074,425, filed 7/16/87, pending, entitled *Processing Apparatus and Method*; by Loewenstein, Lee; Davis, Cecil; and Jucha, Rhett;

Ser. No. 073,947, filed 7/16/87, abandoned, entitled *Processing Apparatus and Method*; by Davis, Cecil; Loewenstein, Lee; and Jucha, Rhett;

Ser. No. 074,452, filed 7/16/87, abandoned, entitled *Processing Apparatus and Method*; by Jucha, Rhett; Davis, Cecil; and Loewenstein, Lee;

Ser. No. 074,454, filed 7/16/87, abandoned, entitled *Processing Apparatus and Method*; by Jucha, Rhett; Davis, Cecil; and Loewenstein, Lee;

Ser. No. 074,422, filed 7/16/87, pending, entitled *Processing Apparatus and Method*; by Davis, Cecil; Matthews, Robert; Jucha, Rhett; and Loewenstein, Lee;

Ser. No. 074,113, filed 7/16/87, abandoned, entitled *Processing Apparatus and Method*; by Davis, Cecil; Matthews, Robert; Loewenstein, Lee; Jucha, Rhett; Hildenbrand, Randy; and Jones, John;

Ser. No. 073,940, filed 7/16/87, pending, entitled *Processing Apparatus and Method*; by Davis, Cecil; and Matthews, Robert;

Ser. No. 075,017, filed 7/17/87, pending, entitled *Processing Apparatus and Method*; by Loewenstein, Lee;

Ser. No. 073,946, filed 7/16/87, pending, entitled *Processing Apparatus and Method*; by Davis, Cecil; and Matthews, Robert;

Ser. No. 073,938, filed 7/16/87, abandoned, entitled *Processing Apparatus and Method*; by Davis, Cecil; and Matthews, Robert;

Ser. No. 122,605, filed 11/17/87, pending, entitled *Processing Apparatus and Method*; by Jucha, Rhett; Davis, Cecil; and Loewenstein, Lee;

Ser. No. 117,707, filed 11/05/87, pending, entitled *Processing Apparatus and Method*; by Freeman, Dean; and Burris, James;

Ser. No. 117,708, filed 11/05/87, pending, entitled *Processing Apparatus and Method*; by Freeman, Dean; and Burris, James; and Ser. No. 159,852, filed 2/22/88(TI-12730), now U.S. Pat. No. 4,793,896, entitled *Improved Method for Forming Local Interconnects Using Chlorine Bearing Agents* by Douglas, Monte A.

BACKGROUND OF THE INVENTION

1. Field Of The Invention

The present invention relates to a method of manufacturing integrated circuits and other electronic devices. More particularly, the invention relates to an improved process for the forming and etching of titanium containing film on a semiconductor wafer.

2. Description Of The Related Art

Interconnect technology is increasingly a major limitation in the fabrication of very large scale integrated circuits. In the past, the various methods have been utilized to interconnect different portions of integrated circuits. Another and more efficient method for forming interconnects has been developed. This method forms what are called local interconnects.

A local interconnect generally refers to an interconnection that provides direct local connections between the source and drain junctions at the interconnect level and the gate interconnect level, without the use of additional contacts and metal straps.

U.S. Pat. No. 4,675,073 ('073), owned by a common assignee and incorporated by reference, discloses a method for forming titanium nitride local interconnects using a well known plasma etch process. One local interconnect structure, disclosed in '073, is formed from a layer of titanium nitride that is in direct contact with the exposed gate electrode material after the gate level of interconnect has been defined and etched. Another local interconnect structure, as disclosed in '073, can be formed from a layer of titanium nitride that connects the source or drain of a first transistor to the source or drain of a second transistor. In either case, however, the local interconnect layer cannot be the same material as the gate electrode or the gate level of interconnect because the etch process required to define the local interconnects must have high selectivity to the gate and junction interconnect materials. If it does not, these interconnections may be seriously degraded during the local interconnect etching step. Thus, the forming and etching processes for local interconnects must be highly selective in order to efficiently manufacture devices using local interconnects.

U.S. patent application Ser. No. 074,377 filed Jul. 16, 1987, incorporated by reference, discloses an advanced vacuum processor. Such a process can be used to etch or deposit various materials. It utilizes both a remotely generated plasma and a plasma generated in the process chamber whose feed gas is the discharge of the remote plasma generator. In this way, it is able to achieve a synergistic combination of etchant power sources for various materials, thereby, obtaining higher etch rates with more control over both anisotropy and selectivity.

SUMMARY OF THE INVENTION

Described herein is a process for etching of a titanium containing film in a process chamber which comprises: generating at least free radicals from at least a halogen containing gas in remote plasma generator separated from the process chamber; introducing the free radicals to the process chamber; and generating an in situ plasma within the process chamber from the free radicals.

It has been found useful in performing the above process to generate the free radicals from a gas comprised of, for example, $CCl_4$ and inert gas. In addition, it has also been found useful to generate the in situ plasma within the chamber from the free radicals using a in situ power level where the ratio of the remote plasma generator power level to the in situ power level is, for example, approximately 4:1 and also to perform a cleanup step after removal of the wafer from the process chamber.

These processes are useful for films comprised of titanium nitride, titanium-oxygen, titanium silicide, or titanium. The use of remote and in situ plasmas which are generated simultaneously has been found to be useful for all of these processes.

The advantages are set forth within and toward the end of the description of the preferred embodiment.

BRIEF DESCRIPTION OF THE DRAWINGS

The present invention will be described with reference to the accompanying drawings, wherein.

In the figures, the sizes and dimensions of various parts have been exaggerated or distorted for clarity of illustration and ease of description.

DESCRIPTION OF THE PREFERRED EMBODIMENT

Figure 1:
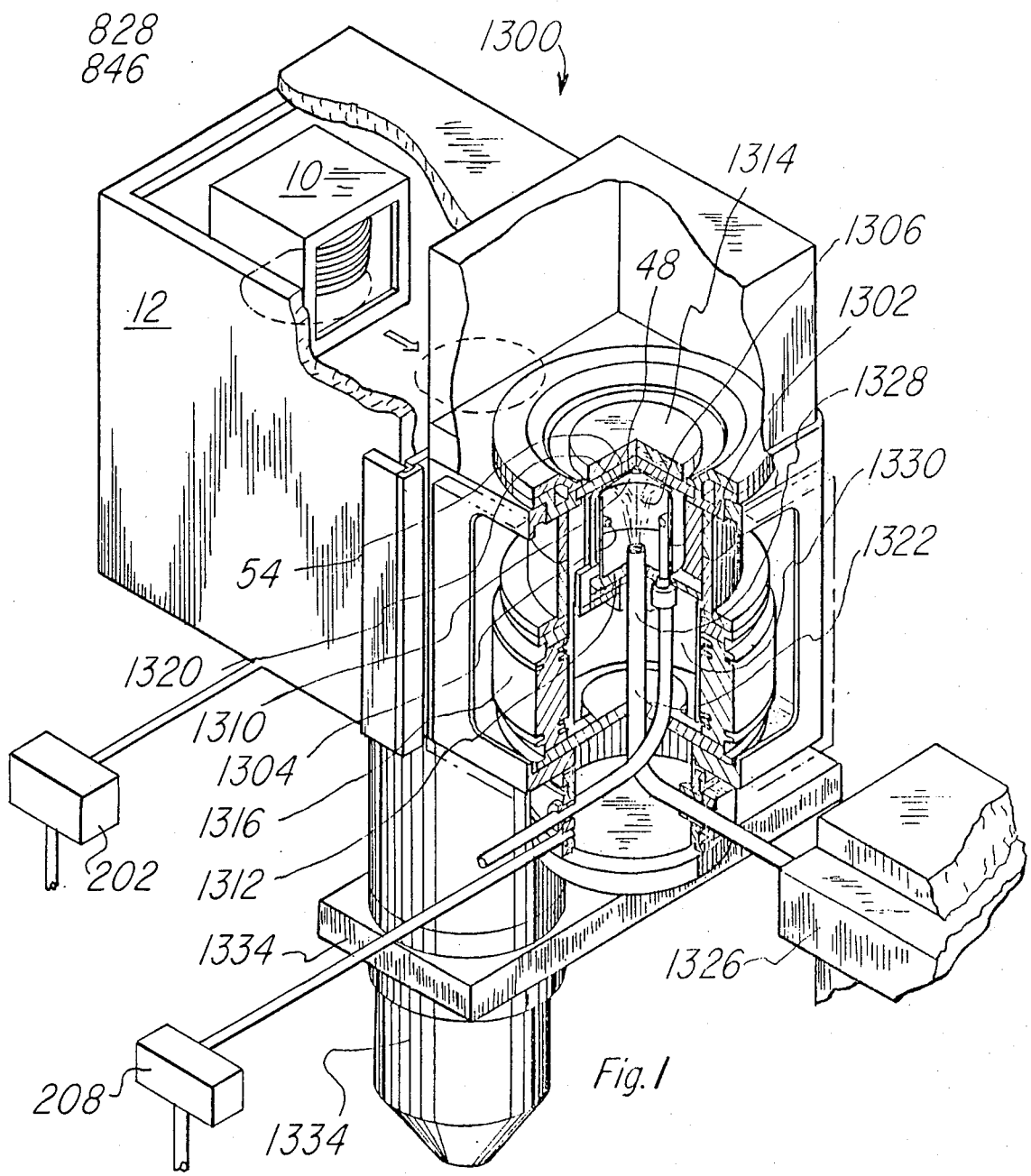
FIG. 1 shows a process module having the capability to produce both an in situ plasma and provide free radicals from a remote plasma generator for performing the present invention.

The present invention can be practiced using a processing module described in U.S. patent application Ser. No. 074,415, filed Jul. 16, 1987, which is incorporated by reference, or any other process module capable of providing plasma products, i.e. predominantly free radicals, and generating an in situ plasma from those free radicals. An example of a processing module that can be used to perform this process is shown in FIG. 32 of that application and is described in the specification. FIG. 1 of this application is identical to FIG. 32 of the incorporated patent application and shows a process module having the capability to produce both an in situ plasma and to provide free radicals from a remote plasma generator for performing the present invention.

Referring to FIG. 1, a process module 1300 is shown. This process module has remote and in situ plasma capability. The wafer carrier 10, a transfer arm (not shown) and chamber 12 are utilized to transfer the wafer 48 from the carrier 10 to the process module 1300. Module 1300 is shown with a gas distributor 1302 attached to a gas distribution ring 1304 which is located in the upper part of top process chamber 1306. The gas distributor 1304 can supply a second gas mixture to the process module. The ring 1304 is arranged about the vertical axis of the chamber 1306. The gas exits from ring 1304 through a plurality of openings 1310 in the bottom of ring 1304. The vertical walls of chamber 1306 can be made of quartz and form a cylinder about the vertical axis of chamber 1306. The bottom of chamber 1306 is an electrode 1312. The top of chamber 1306 in the closed position is an electrode 1314. A heat exchanger (not shown) can be provided for electrode 1314, if desired, for example, to maintain an ambient temperature of, for example, 25 degrees C.

The chamber 1306 is opened and closed by a bellows 1316. The bellows 1316 moves the vertical walls of chamber 1306 upward and into contact with the electrode 1314 or an adjacent portion of module 1300. A seal (not shown) can be provided at the location where the vertical wall of chamber 1306 comes into contact with electrode 1314 or an adjacent portion of module 1300. The bellows moves the chamber 1306 upward to close the chamber and downward to open the chamber. In the open position the arm can transfer the wafer 48 from the carrier through chamber 12 and into the chamber 1306 onto fingers or pins 1320. When the chamber 1306 is closed, the fingers 1320 move upward to place the wafer 48 into contact with electrode 1314.

The remote plasma is supplied into the bottom of chamber 1306 along the vertical axis through a pipe 1322. Pipe 1322 extends from a remote plasma generator 1326 and through electrode 1312 into chamber 1306. The pipe 1322 has a slip fit 1328 with electrode 1312 to accommodate the vertical movement of chamber 1306 including that of electrode 1312. Below electrode 1312 is located a chamber 1330 which is connected to pump 1332 and valve 1334. Thus a generally downward flow of gas through chambers 1306 and 1330 is provided. The in situ plasma is provided by the application of appropriate voltages between electrodes 1312 and 1314. The voltage would be RF to provide the desired excitation to the gas in chamber 1306. Pump 1332 and valve 1334 provide the desired vacuum within chamber 1306. This the remote plasma from generator 1326 and the in situ plasma generated within the chamber 1306 are joined in acting on face 54. The distributor 1302 also has a slip fit with electrode 1312. Distributor 1302 extends along the vertical wall of chamber 1306. The process module 1300 is adapted to perform various processes.

After the desired operation is finished, the gas supplied through pipe 1322 is cut off, and the process module 1300 is pumped down to the same pressure as the rest of the process module ($10^{-3}$ Torr or less). A holding time may then be interposed, for thermal stabilization of the process module or for release of possible suspended particulates, and then the process module 1300 is opened and a transfer arm (not shown) removes the wafer from chamber 12.

Module 1300 includes the capability for process enhancement by in situ plasma and the capability is also provided for providing activated species, generated by gas flows through an additional plasma discharge which is remote from the wafer face to the wafer face. The module is shown in a process station 1300 which includes only one module and one vacuum load lock, but can also be used in embodiments where a central handling chamber is combined with plural process modules 1300 and one or more vacuum load lock chambers 12.

Note that a particulate sensor 202 is explicitly shown connected to the interior of the vacuum load lock chamber 12. This particulate sensor 202 need not be physically located very close to the docking position of vacuum wafer carrier 10, as long as the signal from particulate sensor 202 does provide an indication of the level of particulates present in the interior of the vacuum load lock chamber 12. The particulate sensor 202 is usefully located downstream from the vacuum load lock 12, in the pump out path (not shown). The particle sensor is, for example, a commercially available laser particle counter (which detects individual particles) combined with a counter which provides an output signal showing the number of particles counted over a certain time duration.

Module 1300 can perform processes for the etching of titanium containing film, e.g. titanium, titanium nitride, titanium-oxygen, which is part of an overall process for manufacturing local interconnects. These processes are described in detail hereinafter.

Figure 2:
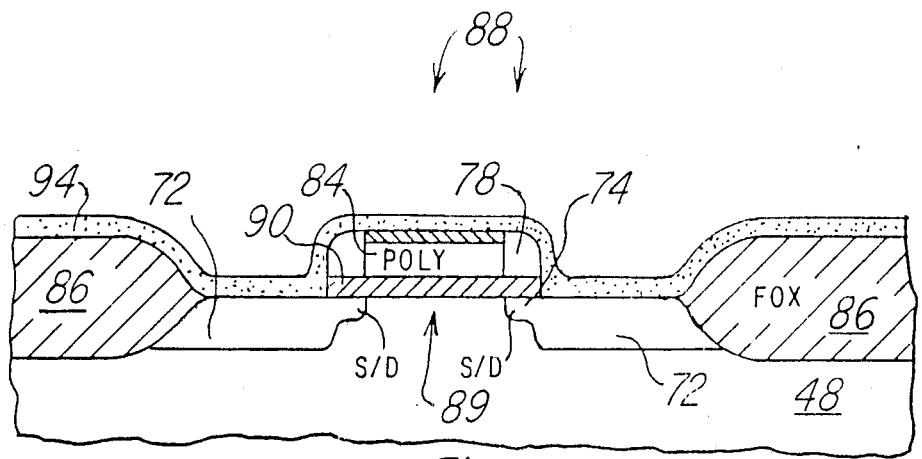
FIG. 2 shows a cross sectional view of a semiconductor wafer at an intermediate manufacturing step which has a titanium layer.

FIG. 2 shows a cross sectional view of a semiconductor wafer at an intermediate manufacturing step. A portion of wafer 48 which has device isolation regions (in this case field oxide region 86) is patterned to define moat regions 88 where active devices are to be formed. The field oxide 86 has the characteristic shape of a local oxidation of silicon (LOCOS) field oxide, but the present invention can of course be practiced using other isolation technologies, such as sidewall mask isolation or direct moat isolation.

A transistor 89 is shown in moat region 88. This transistor 89 includes source/drain regions 72, including lightly doped source/drain extensions 74 (commonly referred to as LDD regions). A polysilicon gate 84 is capacitatively coupled, through gate oxide 90, to channel region 76. Sidewall oxide filaments 78 are shown adjacent to the gate 84 and a gate oxide 90 is shown beneath the gate 84. The use of sidewall oxide filaments 78 is shown merely as an example. This method is equally applicable to transistors without sidewall oxides. Finally, a layer of unreacted titanium metal 94 covers the entire surface. Layer 94 is deposited to more than 600 A and less than 2000 A thickness.

Figure 3A:
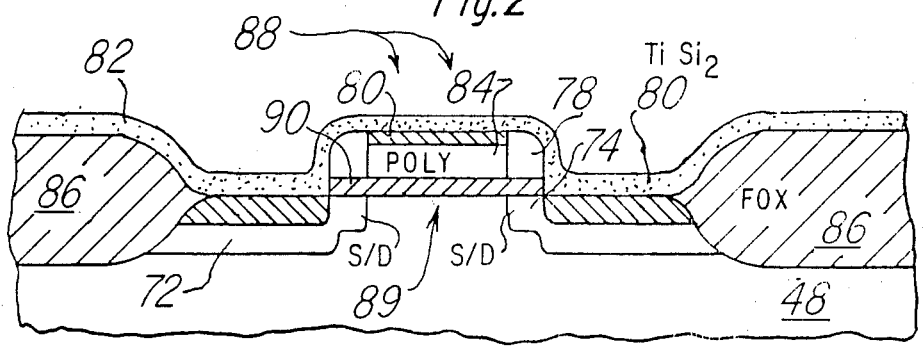
FIGS. 3(a), 3(b), and 3(c) show cross sectional views of a semiconductor wafer of FIG. 2 at successive manufacturing steps.
Figure 3B:
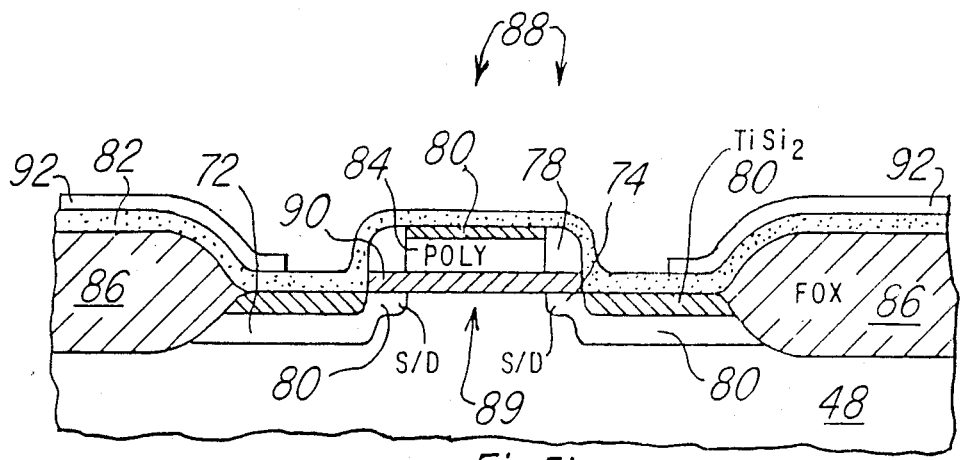
Figure 3C:
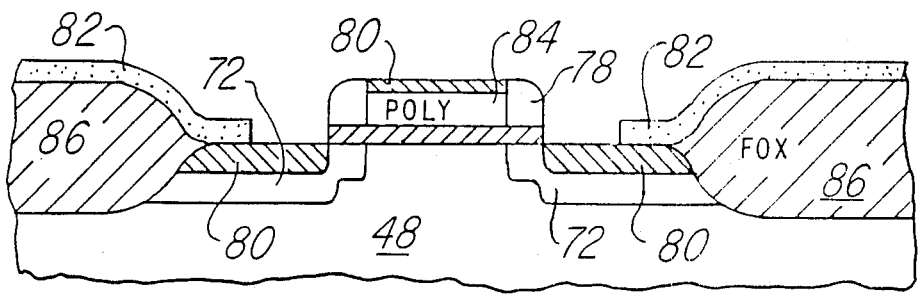

FIGS. 3(a), 3(b), and 3(c) show cross sectional views of a semiconductor wafer of FIG. 2 at successive manufacturing steps. FIG. 3(a) shows the wafer 48 as shown in FIG. 2, after a silicidation step is performed. This causes titanium silicide regions 80 to form where the titanium metal layer 94 was in contact with the silicon wafer 48. The silicidation step also causes formation of the titanium nitride layer 82. Titanium nitride layer 82 that is formed will typically be thin everywhere, but will be thinner over the silicide regions 80 than over the field oxide 86. The thickness of the titanium nitride layer 82 layer may be increased by an additional deposit and silicidation step. A process for increasing the thickness is generally described in U.S. Pat. No. 4,676,866 which is owned by the assignee of this application and incorporated by reference. (Note that the alloy compositions in the first and second metal deposit steps do not have to be identical.)

It should be noted that the titanium metal used to produce layer 82 need not be strictly pure titanium. It may be desired to introduce alloying elements into the as-deposited metal, to provide better physical properties in the resulting silicides and nitrides; and these embodiments, where the reaction chemistry and the properties of the resulting structures are approximately the same as that occurring with titanium, are also within the scope of the present invention.

The silicidation step generally described above can be performed at a temperature in the range between 500° C. and about 750° C. for a time in range of 15 to 90 minutes (preferably, less than 40 minutes) in a nitrogen atmosphere. In particular, one silicidation process which yielded acceptable results was performed depositing layer 94 by sputtering at room temperature to a thickness of approximately 900 Angstroms. The substrate was then heated in the silicidation step to approximately 675° C. for 30 minutes in an atmosphere of nitrogen and argon at a pressure of 1 atmosphere.

Referring now to FIG. 3(b) a photoresist layer 92 selectively masks off portions of the reacted titanium layer 82, where titanium nitride local interconnects are desired. It is well known that a halogen discharge will etch titanium nitride freely, a simple halogen discharge will also etch $TiSi_2$ rapidly. In addition, it is well known that halogen deficient plasmas are effective in selective etching. The use of chloro- and fluoro-carbons has been shown to be itself particularly advantageous (see, for example, '073).

Module 1300, described above, and shown in FIG. 1 can then be used to etch the unmasked portions of the titanium nitride layer 94 on wafer 48 shown in FIG. 3(b) while providing improved selectivity to the photoresist and silicide layers 80.

Vacuum wafer carrier 10 containing wafer 48 is placed into chamber 12. Chamber 12 is then pumped to a vacuum and the door (not shown) to vacuum wafer carrier 10 is then opened. A transfer arm (not shown) then removes the wafer 48 from the carrier and moves it to the process chamber 1306. Wafer 48 is placed on fingers 1320 by the transfer arm. The transfer arm is retracted from the process chamber 1306 and wafer 48 is placed in contact with electrode 1314 or an adjacent portion of process module 1300 as chamber 1306 closed by bellows 1316 as described above. The desired process gasses, e.g. chloro-carbons and fluoro-carbons gasses are turned on. The remote plasma generator 1326 is activated and free radicals generated by it flow from the generator 1326 through pipe 1322 into chamber 1306 and to the face of the wafer 48. Radio frequency voltage is impressed across electrodes 1312 and 1314, thereby generating an in-situ plasma within the process chamber 1306 from the free radicals from pipe 1322. If desired, an inert gas can be supplied via gas distributor ring 1304. When the desired etch is complete, the power to the electrodes 1312 and 1314 and to the plasma generator 1326 is turned off and the gas flow to pipe 1322 is stopped. The bellows 1316 moves downward thereby opening the process chamber as described above, thus allowing the transfer arm to enter the process chamber 1306 and retrieve wafer 48 as described above. The transfer arm then returns the wafer 48 to the vacuum wafer carrier 10 in chamber 12 as described above. Interconnect 82 contacts silicide 80 which in turn contacts the source/drain region 72 and passes over field oxide 86 to, for example, form another smilar contact. The resulting local interconnects 82 are depicted in FIG. 3(c).

A useful gas mixture of Helium and CCl$_4$ with remote plasma and in situ plasma is shown to improve etch rate over the sum of the rates of in situ and remote plasmas used separately and to provide selectivity between titanium nitride and/or titanium-oxygen and other materials.

One useful process which yielded acceptable results while etching the titanium nitride layer 82 using module 1300 used an RF power of 100 watts in the process chamber at 13.56 MHz and a remote plasma generator operating at 400 watts at 2450 MHz. The gases used were Helium at 70 sccm, CCl$_4$ at 70 sccm. The pressure was 0.3 Torr and the temperature 75 degrees C. This process results in improved results because of a synergistic effect between the remote and in situ plasmas. These results were obtained even though they had not been optimized for the particular conditions used, but they do show the synergistic advantage of combining these two effects with respect to both selectivity and etch rate. The surface damage is minimized while the etch rate is improved. Additionally, the remote and in situ plasmas can be separately controlled. The resultant etch is partially anisotropic and selective. The level of anisotropy and selectivity is controlled by the relative RF plasma and microwave power levels, as well as the pressure.

It should also be noted that a silicon nitride mask or a hardened photoresist could be used as a replacement for the photoresist layer 92. A similar method uses an oxide mask in place of the photoresist layer 92. In another method, an oxide, used to pattern the titaniun nitride layer 82, remains in place after the forming of the local interconnects to protect the titanium reaction products. In yet another method, low-temperature oxide is also used except that in this case the mask is not patterned and the entire wafer is then placed in a furnace creating TiO$_x$ in areas where the titanium is over an oxide. The entire oxide mask is then removed which exposes the entire surface of the wafer and all of the titanium products. Process module 1300 can then be used, as described above, to etch the exposed titanium nitride or the TiO$_x$ resulting from any of the above processes.

It should also be noted that the present invention is applicable to a tremendous variety of processes which are quite different in many respects from that described; for example, the present invention is perfectly well applicable to metal containing films on SOI materials, or to processes using trench transistors, as well as to the more conventional bulk-CMOS processes primarily described.

Unless specifically stated otherwise above the power and frequencies used for RF and microwave plasma can be widely varied, as can the other process parameters. The term low pressure as used herein indicates a pressure which is less than ambient pressure.

Following the formation of local interconnects 82 over processes are performed to complete the desired structure for example, a DRAM, SRAM, CMOS logic device etc.

Although silicon examples are shown herein wafers metal containing films on wafers made of other materials such as germanium, etc., can be etched. The wafers can be comprised of many different configurations, for example, a single piece of crystal material or small crystals located on a larger substrate. The plasma produced as disclosed herein will include free radicals. Although wafers such as wafer 48 are disclosed herein other types of flat workpieces could be used with the techniques disclosed herein.

The result of processing the wafer 48 can be electronic devices, for example, integrated circuits or discrete semiconductor devices. Once the processing is completed the wafers are divided into devices. The circuits and devices are enclosed into packages, for example, as shown in Orcutt U.S. Pat. Nos. 4,465,898 issued to et al on Aug. 14, 1984 and Birchler U.S. Pat. No. 3,439,238 issued to et al on Apr. 15, 1969, which are incorporated hereinto by reference. These packages are then utilized in the construction of printed circuit boards. The printer circuits boards, which cannot operate without the packaged integrated circuits and devices to perform their intended functions, are the required electrical components within computers, photocopiers, printers, telecommunication equipment, calculators, and all of the other electronic equipment which are an essential ingredients of the electronic and information age. Thus electronic equipment cannot function without these circuits and devices.

The present application describes a processing method, which contains numerous additional features which serve to provide further advantages.

It is an advantage of the present invention to provide a process which increases the selectivity of an etch process between titanium nitride and/or titanium-oxygen and other materials.

It is an advantage of the present invention to provide a process which allows improved control over the anisotropy of the etch.

It is an advantage of the present invention to provide a process which allows improved control over the anisotropy and selectivity of the etch by allowing the separate adjustment of the power utilized to generate the remote and in situ plasmas.

It is an advantage of the present invention to provide a process which utilizes separate control over the generation of in situ and remote plasma generation and which obtains a synergistic effect from utilizing both types of plasma.

Having described the invention in connection with certain specific embodiments thereof, it is to be understood that further modifications may now suggest themselves to those skilled in the art, it is intended to cover all such modifications as fall within the scope of the appended claims.

What is claimed is:

1. A process for etching of a titanium containing film in a process chamber comprising the steps of:
   (a) generating at least free radicals from at least a halogen containing gas in remote plasma generator separated from the process chamber;
   (b) introducing said free radicals to said process chamber; and
   (c) generating an in situ plasma within the process chamber from said free radicals.

2. The process as set forth in claim 1 wherein said film also includes titanium-oxygen.

3. The process as set forth in claim 1 wherein said film also includes titanium silicide.

4. The process as set forth in claim 1 wherein said gas selectively etches one taken from the group containing titanium-oxygen, titanium, titanium nitride or a combination thereof versus titanium silicide.

5. The process as set forth in claim 1 wherein said process is used to form local interconnects.

6. The process as set forth in claim 1 wherein said film also includes titanium nitride.

7. The process as set forth in claim 1 wherein said halogen containing gas is $CCl_4$.

8. The process as set forth in claim 1 wherein said halogen containing gas is $CF_4$.

9. The process as set forth in claim 1 wherein said gas includes an inert gas.

10. The process as set forth in claim 9 wherein said inert gas is taken from a group consisting of helium or a noble gas.

11. The process as set forth in claim 9 wherein said inert gas is helium.

12. The process as set forth in claim 1 wherein said at least free radicals and in situ plasma are generated simultaneously.

13. The process as set forth in claim 1 wherein the process is carried out at 75 degrees C.

14. The process as set forth in claim 1 wherein the process is carried out at 0.3 Torr.

15. The process as set forth in claim 9 wherein said gas includes of 70 sccm $CCl_4$ and 70 sccm He.

16. The process as set forth in claim 1 wherein 400 watts is used for generating said at least free radicals and 100 watts is used for generating said in situ plasma.

17. The process as set forth in claim 1 wherein a ratio of a power utilized for generating at least free radicals said at least free radicals and a power utilized for generating said in situ plasma is 4:1.

18. The process as set forth in claim 1 wherein a portion of the film is on a field oxide formed using the local oxidation of silicon method.

19. The process as set forth in claim 1 wherein a portion of the film is on a sidewall oxide filament.

20. The process as set forth in claim 1 wherein a face of the film to be processed faces downward.

21. The process as set forth in claim 1 further including a cleanup of the process chamber using free radicals generated in a plasma generator remote from the process chamber.

22. The process as set forth in claim 1 further including a cleanup of the process chamber using free radicals generated in a plasma generator remote from the process chamber and an in-situ plasma.

23. A process for etching of a titanium containing film for forming local interconnects, comprising the steps of:
   (a) disposing a wafer having a film at least partially comprised of titanium in a process chamber;
   (b) generating at least free radicals from a gas comprised of $CCl_4$ and an inert gas in a plasma generator remote from the process chamber;
   (c) introducing said free radicals to said process chamber; and
   (d) generating an in situ plasma within said chamber from said free radicals.

24. The process as set forth in claim 23 wherein said film also includes titanium-oxygen.

25. The process as set forth in claim 23 wherein said film also includes titanium silicide.

26. The process as set forth in claim 23 wherein said film also includes titanium nitride.

27. The process as set forth in claim 23 wherein said gas selectively etches one taken from the group containing titanium-oxygen, titanium, titanium nitride or a combination thereof versus titanium silicide.

28. The process as set forth in claim 23 wherein said at least free radicals and in situ plasmas are generated simultaneously.

29. The process as set forth in claim 23 wherein the process is carried out at 75 degrees C.

30. The process as set forth in claim 23 wherein the process is carried out at 0.3 Torr.

31. The process as set forth in claim 23 wherein said gas is comprised of 70 sccm $CCl_4$ and 70 sccm He.

32. The process as set forth in claim 23 wherein a power utilized for generating said at least free radicals is 400 watts and a power utilized for generating in situ plasma is 100 watts.

33. The process as set forth in claim 23 wherein a ratio of a power utilized for generating said at least free radicals and a power utilized for generating said in situ plasma is 4:1.

34. The process as set forth in claim 23 wherein a portion of the film is on a field oxide formed using the LOCOS method.

35. The process as set forth in claim 23 wherein a portion of the film is on a sidewall oxide filament.

36. The process as set forth in claim 23 wherein a face of the film to be processed faces downward.

37. The process as set forth in claim 23 further including a cleanup of the process chamber using free radicals generated in a plasma generator remote from the process chamber.

38. The process as set forth in claim 23 further including a cleanup of the process chamber using free radicals generated in a plasma generator remote from the process chamber and an in-situ plasma.

39. A process for etching of a titanium containing film for forming local interconnects comprising the steps of:
   (a) disposing a wafer having a film at least partially comprised of titanium nitride in a process chamber;
   (b) generating free radicals from a remote microwave plasma at a first power level from a gas comprised of $CCl_4$ and He;
   (c) generating an in situ plasma within said chamber from said free radicals using a second power level wherein the ratio of said first power level to said second power level is approximately 4:1;
   (d) introducing said in situ plasma to said film; and
   (e) cleaning the process chamber using at least the free radicals generated in the plasma generator remote from the process chamber.

40. The process as set forth in claim 39 wherein the cleaning step includes the use of an in-situ plasma.

41. The process as set forth in claim 39 wherein said film also includes titanium-oxygen.

42. The process as set forth in claim 39 wherein said film also includes titanium silicide.

43. The process as set forth in claim 39 wherein said film also includes titanium nitride.

44. The process as set forth in claim 39 wherein said gas selectively etches one taken from the group containing titanium-oxygen, titanium, titanium nitride or a combination thereof versus titanium silicide.

45. The process as set forth in claim 39 wherein a ratio of a power utilized for generating said at least free radicals and a power utilized for generating said in situ plasma is 4:1.

46. The process as set forth in claim 39 wherein said remote and in situ plasmas are generated simultaneously.

47. The process as set forth in claim 39 wherein said wafer is removed from said process chamber prior to said cleanup step.

48. The process as set forth in claim 39 wherein the process is carried out at 75 degrees C.

49. The process as set forth in claim 39 wherein the process is carried out at 0.3 Torr.

50. The process as set forth in claim 39 wherein said gas is comprised of 70 sccm $CCl_4$ and 70 sccm He.

51. The process as set forth in claim 39 wherein a portion of the titanium nitride layer is on a field oxide formed using the LOCOS method.

52. The process as set forth in claim 39 wherein a portion of the titanium nitride layer is on a sidewall oxide filament.

53. The process as set forth in claim 39 wherein a face of the film to be processed faces downward.

* * * * *